(12) United States Patent
Kang et al.

(10) Patent No.: US 11,781,996 B1
(45) Date of Patent: Oct. 10, 2023

(54) OVERLAY MEASURING DEVICE AND METHOD FOR CONTROLLING FOCUS AND PROGRAM THEREFOR

(71) Applicant: AUROS TECHNOLOGY, INC., Hwaseong-si (KR)

(72) Inventors: Ji-Hoon Kang, Hwaseong-si (KR); Hyun-Tae Kim, Hwaseong-si (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 18/142,340

(22) Filed: May 2, 2023

(30) Foreign Application Priority Data

Nov. 2, 2022 (KR) .................. 10-2022-0144235

(51) Int. Cl.
*G01N 21/956* (2006.01)
*G01N 21/95* (2006.01)
*G01N 21/88* (2006.01)

(52) U.S. Cl.
CPC ....... *G01N 21/956* (2013.01); *G01N 21/8806* (2013.01); *G01N 21/9501* (2013.01); *G01N 2201/103* (2013.01)

(58) Field of Classification Search
CPC ............. G01N 21/956; G01N 21/8806; G01N 21/9501; G01N 2201/103
See application file for complete search history.

(56) References Cited

U.S. PATENT DOCUMENTS 6,801,650 B1 * 10/2004 Kikuchi .............. G03F 7/70691
250/548
2002/0001403 A1 * 1/2002 Kikuchi .............. G03F 7/70616
382/145
(Continued)

FOREIGN PATENT DOCUMENTS

| JP | 2003-031493 A | 1/2003 |
| KR | 10-2006-0100112 A | 9/2006 |
| KR | 10-2020-0031774 A | 3/2020 |

(Continued)

OTHER PUBLICATIONS

Korean Office Action for related KR Application No. 10-2022-0144235 dated Jan. 11, 2023 from Korean Intellectual Property Office.

(Continued)

*Primary Examiner* — Roy M Punnoose
(74) *Attorney, Agent, or Firm* — Paratus Law Group, PLLC

(57) ABSTRACT

There are provided an overlay measuring device and a method for controlling a focus and a program therefor. An overlay measuring device controlling a focus in one embodiment includes an objective lens; a memory; a lens focus actuator operating the objective lens to adjust a distance between the objective lens and a wafer; and a processor controlling operations of the memory and the lens focus actuator, wherein the processor is configured to obtain a first height value in relation to each site of the wafer, match the obtained first height value and a corresponding site and store (Continued)

the same, and as initial measurement in relation to each site of the wafer starts, control the lens focus actuator, based on the stored first height value of the site, to control a Z-axis movement of the objective lens.

17 Claims, 4 Drawing Sheets

(56) References Cited

U.S. PATENT DOCUMENTS

2011/0141463 A1* 6/2011 Chikamatsu ......... G01N 21/956
  356/237.5
2022/0196572 A1* 6/2022 Marks .................... G01N 21/45

FOREIGN PATENT DOCUMENTS

| KR | 10-2020-0130749 A | 11/2020 |
| KR | 10-2021-0031015 A | 3/2021 |
| KR | 10-2022-0003907 A | 1/2022 |

OTHER PUBLICATIONS

Korean Notice of Allowance for related KR Application No. 10-2022-0144235 dated Apr. 20, 2023 from Korean Intellectual Property Office.

* cited by examiner

OVERLAY MEASURING DEVICE AND METHOD FOR CONTROLLING FOCUS AND PROGRAM THEREFOR

CROSS-REFERENCE TO RELATED APPLICATION

This application claims priority to Korean Patent Application No. 10-2022-0144235 (filed on Nov. 2, 2022), which is hereby incorporated by reference in its entirety.

BACKGROUND

The present disclosure relates to an overlay measuring device and a method for controlling a focus, and a program therefor.

With the advancement in technologies, the size of a semiconductor wafer measuring the properties of a wafer tends to decrease, and the density of the integrated circuit of a measuring device tends to increase. As an integrated circuit is placed on a wafer, a variety of manufacturing processes are required to consecutively form desired circuit structures and elements in specific positions. In the manufacturing processes, a patterned layer is consecutively formed on a wafer.

Based on the repetitive stacking processes, patterns electrically activated are formed in an integrated circuit. At this time, unless each structure is arranged within a range of errors allowable in manufacturing, the electrically activated patterns interfere with each other, causing deterioration in the performance and reliability of a manufactured circuit. An overlay measuring tool is used to measure and verify an error in the arrangement between layers.

Ordinary overlay measurement and methods involve measuring and verify whether the arrangement between two layers is within an allowable error range. One of the methods involves forming a structure called an overlay mark in a specific position of a substrate and photographing the structure with an optical image-obtaining device to measure an overlay.

To perform such measurement, a stage is moved in the X and Y-axis (i.e., the X axis and the Y axis) direction, and then an objective lens is moved in the Z-axis direction, in the related art.

In the method of the related art, since the stage is moved to the position of a site to be measured, on the X and Y-axis, and then the objective lens is adjusted in the Z-axis direction, based on a height measured through an auto focus (AF) system, causing an increase in measurement time (e.g., Move Acquire Measure (MAM) time) in relation to a wafer and deterioration in workability.

Under the circumstances, there is a growing demand for technologies of predicting a height in relation to each site of a wafer and moving a stage and an objective lens at the same time, leading to a decrease in the measurement time in relation to the wafer.

SUMMARY

The present disclosure is to provide an overlay measuring device and a method for controlling a focus and a program therefor.

The present disclosure is to provide an overlay measuring device and a method capable of moving a stage and an objective lens at the same time and a program therefor.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

An overlay measuring device controlling a focus in one embodiment may comprise an objective lens; a memory; a lens focus actuator operating the objective lens to adjust a distance between the objective lens and a wafer; and a processor controlling operations of the memory and the lens focus actuator, wherein the processor may be configured to obtain a first height value in relation to each site of the wafer, match the obtained first height value and a corresponding site and store the same, and as initial measurement in relation to each site of the wafer starts, control the lens focus actuator, based on the stored first height value of the site, to control a Z-axis movement of the objective lens.

A method for controlling a focus by an overlay measuring device in one embodiment may comprise: obtaining a first height value in relation to each site of a wafer; matching the obtained first height value and a corresponding site and storing the same; and as initial measurement in relation to each site of the wafer starts, controlling a Z-axis movement of the objective lens, based on the stored first height value of the site.

In a computer-readable storage medium in which a program storing instructions to control a focus of an overlay measuring device is recorded, in one embodiment, the program may comprise: instructions to obtain a first height value in relation to each site of a wafer; instructions to match the obtained first height value and a corresponding site and store the same; and as initial measurement in relation to each site of the wafer starts, instructions to control a Z-axis movement of the objective lens, based on the stored first height value of the site.

According to the present disclosure, a height value is obtained in relation to each site of a wafer, and as initial measurement in relation to each site of the wafer starts, the Z-axis movement of an objective lens is controlled based on the stored height value of a corresponding site, making it possible to reduce measurement time in relation to the wafer.

According to the present disclosure, the X and Y-axis movement of a stage on which a wafer is placed, and the Z-axis movement of the objective lens are performed at the same time, thereby ensuring improvement in workability, resulting from a reduction in measurement time.

According to the present disclosure, a second height value in relation to the wafer is obtained based on a first height value in the state where the Z-axis movement of the objective lens is completed, a difference between the first height value and the second height value is modeled, and the Z-axis movement of the objective lens is efficiently controlled based on a predicted height value, at the following site.

According to the present disclosure, a height value obtained at a current site of a wafer is stored in a memory or updated to measure a height value of the following site, and is applied to the following site, making it possible to predict the Z-axis movement of the objective lens.

According to the present disclosure, a height value obtained at a current site of a wafer is stored in a memory or updated, to measure a height value of the following site, ensuring improvement in prediction, despite a difference on the Z-axis caused by a significant change in wafers and hardware conditions of the overlay device.

Specific effects are described along with the above-described effects in the section of detailed description.

BRIEF DESCRIPTION OF THE DRAWINGS

The accompanying drawings constitute a part of the specification, illustrate one or more embodiments in the disclosure, and together with the specification, explain the disclosure.

DETAILED DESCRIPTION

Figure 1:
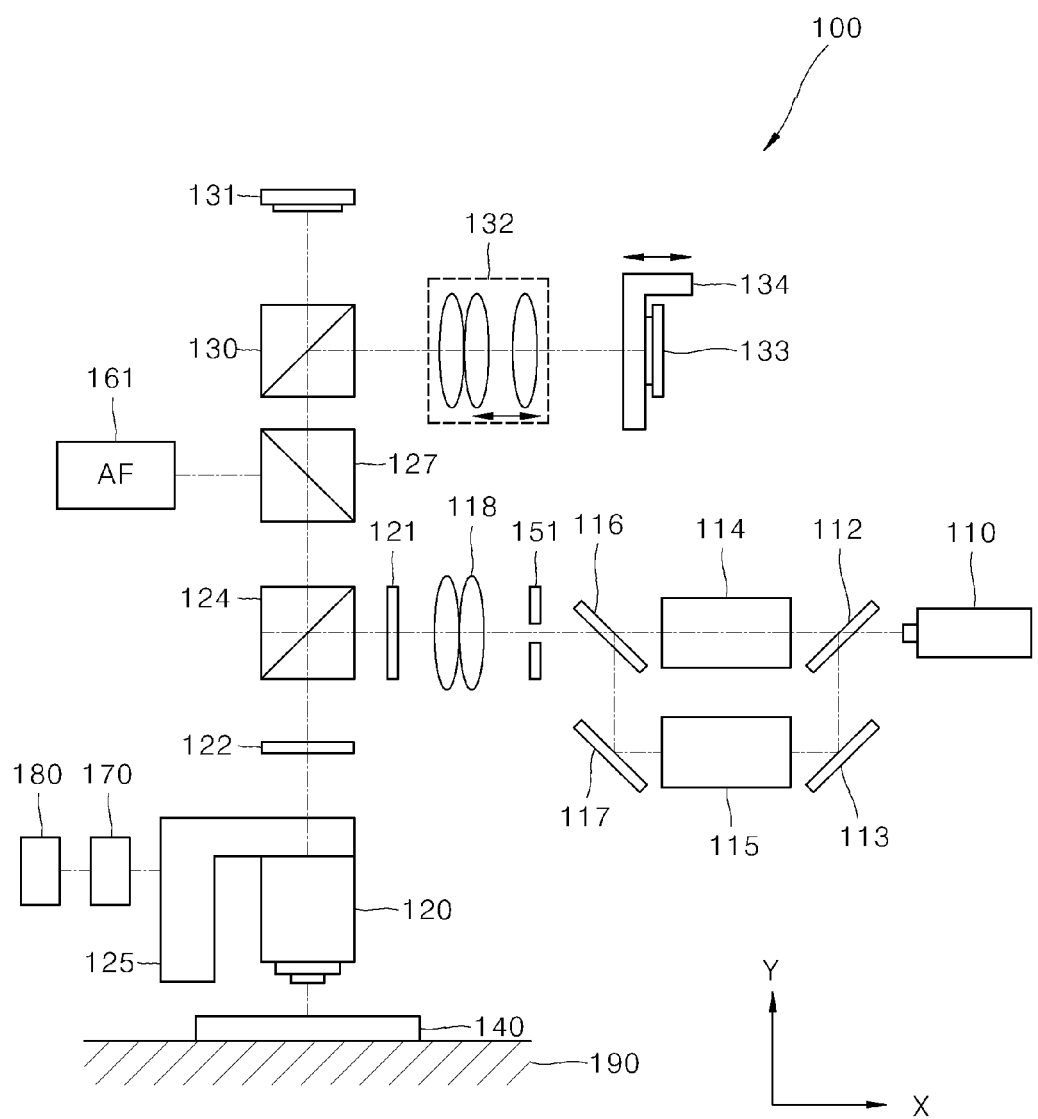
FIG. 1 is a conceptual view sowing an overlay measuring device in one embodiment.

The above-described aspects, features and advantages are specifically described hereafter with reference to the accompanying drawings such that one having ordinary skill in the art to which the present disclosure pertains can embody the technical spirit of the disclosure easily. In the disclosure, detailed description of known technologies in relation to the subject matter of the disclosure is omitted if it is deemed to make the gist of the disclosure unnecessarily vague. Hereafter, preferred embodiments according to the disclosure are specifically described with reference to accompanying drawings. In the drawings, identical reference numerals can denote identical or similar components.

The terms "first", "second" and the like are used herein only to distinguish one component from another component. Thus, the components should not be limited by the terms. Certainly, a first component can be a second component, unless stated to the contrary.

When one component is described as being "in the upper portion (or lower portion)" or "on (or under)" another component, one component can be directly on (or under) another component, and an additional component can be interposed between the two components.

When any one component is described as being "connected", "coupled", or "connected" to another component, any one component can be directly connected or coupled to another component, but an additional component can be "interposed" between the two components or the two components can be "connected", "coupled", or "connected" by an additional component.

Throughout the disclosure, each component can be provided as a single one or a plurality of ones, unless explicitly stated to the contrary.

The singular forms "a", "an" and "the" are intended to include the plural forms as well, unless explicitly indicated otherwise. It should be further understood that the terms "comprise" or "include" and the like, set forth herein, are not interpreted as necessarily including all the stated components or steps but can be interpreted as excluding some of the stated components or steps or can be interpreted as including additional components or steps.

Throughout the disclosure, the terms "A and/or B" as used herein can denote A, B or A and B, and the terms "C to D" can denote C or greater and D or less, unless stated to the contrary.

Hereafter, an overlay measuring device and method controlling a focus and a program therefor in several embodiments.

FIG. 1 is a conceptual view sowing an overlay measuring device in one embodiment.

Referring to FIG. 1, the overlay measuring device 100 in one embodiment measures an error between a first overlay mark OM1 and a second overlay mark OM2 respectively formed in different layers that are formed at a wafer 140.

For example, the first overlay mark OM1 may be an overlay mark that is formed in a previous layer, and the second overlay mark OM2 is an overlay mark that is formed in a current layer. The overlay marks are formed in a scribe lane while forming a layer for forming a semiconductor device, in a die area. For example, the first overlay mark OM1 may be formed together with an insulation layer pattern, and the second overlay mark OM2 may be formed together with a photoresist pattern that is formed on the insulation layer pattern.

At this time, the first overlay mark OM1 is covered by the photoresist layer, while the second overlay mark OM2 is exposed outward, and the first overlay mark OM1 is made of an oxide having optical properties that differ from those of the second overlay mark OM2 comprised of a photoresist material. Additionally, the focal surface of the first overlay mark OM1 and the focal surface of the second overlay mark OM2 are identical with each other or different from each other.

The overlay measuring device 100 in one embodiment may comprise a light source 110, a first beam splitter 112, a first mirror 113, a first spectrum filter (a color filter) 114, a second spectrum filter 115, a beam combiner 116, a second mirror 117, a relay lens 118, a polarizing filter 121, an aperture 151, a second detector 133, a focus actuator 134, a zoom lens 132, a first detector 131, a second beam splitter 130, an optical element 127, a third beam splitter 124, a lambda wave plate 122, an objective lens 120, a lens focus actuator 125, an aperture 151, an auto focus (AF) 161, a processor 170, and a memory 180.

The configuration of the overlay measuring device 100 illustrated in FIG. 1 is provided as an example, and components of the overlay measuring device 100 are not limited to those of the embodiment illustrated in FIG. 1, and when necessary, some components may be added, changed or removed. For example, the overlay measuring device 100 may comprise a memory 180 in which instructions, programs, logics and the like for enabling a processor 170 to control the operation of each component of the overlay measuring device 100 are stored.

In one embodiment, the light source 110 may comprise a halogen lamp, a xenon lamp, a supercontinuum laser, a light-emitting diode, a laser induced lamp and the like.

In one embodiment, the first beam splitter 112 splits a beam generated from the light source 110 into two beams. The first beam splitter 112 transmits some of the beam generated from the light source 110, and reflects some of the beam generate from the light source 110, to split the light source 110 into two beams.

In one embodiment, the first mirror 113 is disposed between the first beam splitter 112 and the second spectrum filter 115, and changes the path of the beam reflected by the first beam splitter 112 toward the second spectrum filter 115.

In one embodiment, the first spectrum filter 114 adjusts the central wavelength and bandwidth of the beam having passed through the first beam splitter 112, out of the beams split by the first beam splitter 112, such that the central wavelength and bandwidth may be appropriate to obtain the image of the second overlay mark OM2 formed in the current layer. The spectrum filter may comprise any one of a filter wheel, a linear translation device and a flipper device.

In one embodiment, the second spectrum filter 115 adjusts the central wavelength and bandwidth of the beam reflected by the first beam splitter 112, out of the beams split by the first beam splitter 112, such that the central wavelength and bandwidth may be appropriate to obtain the image of the first overlay mark OM1 formed in the previous layer. According to the present disclosure, the first spectrum filter and the second spectrum filter may be replaced with various types of filters. Additionally, the spectrum filter may comprise at least one of a filter wheel, a linear translation device and a flipper device.

In one embodiment, the beam combiner 116 combines the light having passed through the first spectrum filter 114 and the light having passed through the second spectrum filter 115. The light having passed through the first spectrum filter 114 passes through the beam combiner 116, and the beam having passed through the second spectrum filter 115 is reflected by the beam combiner 116 and combined with the beam having passed through the beam combiner 116, after its path is changed by the second mirror 117 toward the beam combiner 116, and then passes through the aperture 115.

In one embodiment, the aperture 151 changes the beam having passed through the beam combiner such that the beam may be appropriate to photograph the first overlay mark OM1.

In one embodiment, the second detector 133 detects the beam reflected by the second beam splitter 130. The second detector 133 is disposed at the focus actuator 134, and adjusts a distance between the second beam splitter 130 and the second detector 133. The second detector 133 obtains the image of the first overlay mark OM1.

In one embodiment, the first detector 131 detects the beam having passed through the second beam splitter 130. The first detector 131 may obtain the image of the second overlay mark OM2.

Alternatively, the second detector may not operate based on user settings, and the first detector only may obtain the images of the first overlay mark OM1 and the second overlay mark OM2.

In one embodiment, the zoom lens 132 is disposed between the second beam splitter 130 and the focus actuator 134. The zoom lens 132 receives a position change value of the second detector 133 from the focus actuator 134, and based on the position change value, matches the magnification of the image of the second overlay mark OM2 and the magnification of the image of the first overlay mark OM1. Since an optical path distance between the second detector 133 and the second beam splitter 130 differs from an optical path distance between the first detector 131 and the second beam splitter 130 depending on a difference in the heights of the first overlay mark OM1 and the second overlay mark OM2, the magnification of the image obtained by the first detector 131 and the magnification of the image obtained by the second detector 133 may differ. To measure an overlay error accurately, the magnifications need to be matched.

In one embodiment, the second beam splitter 130 splits the beam gathered by the objective lens 120 into two beams. The second beam splitter 130 may comprise a tube beam splitter and a dichroic filter. The dichroic filter transmits a beam of a specific wavelength. The beam gathered by the objective lens 120 is split into two beams by the second beam splitter 130 through a lambda wave plate 122, a third beam splitter 124 and an optical element 127. That is, the beam gathered by the objective lens 120 splits into a beam appropriate to detect the first overlay mark OM1 and a beam appropriate to detect the second overlay mark OM2.

In one embodiment, the optical element 127 may comprise a hot mirror and a cold mirror.

In one embodiment, the third beam splitter 124 splits the beam combined through the beam combiner 116 into two beams again. The beam combined through the beam combiner 116 is split into two beams by the third beam splitter 124, through a relay lens 118 and a polarizing filter 121, in a polarized state.

In one embodiment, the objective lens 120 concentrates the beam, being combiner by the combiner 116, being reflected by the third beam splitter 124 and then becoming one beam of polarized light through the lambda wave plate 122, on the measurement position of a wafer, and gathers a beam being reflected in the measurement position. The objective lens 120 is disposed at the lens focus actuator 125.

In one embodiment, the lens focus actuator 125 adjusts a distance between the objective lens 120 and a wafer 40 such that a focus surface may be placed at the first overlay mark OM1 or the second overlay mark OM2. The lens focus actuator 125 moves the objective lens 120 perpendicularly toward the wafer (e.g., in the Y direction), under the control of the processor 170, to adjust a focal length.

In one embodiment, when adjusting a focus surface, the lens focus actuator 125 may adjust a focal length in another position as well as in the position of the current layer or the previous layer.

In one embodiment, the optical element is installed in a way that the optical element and the path of the beam having passed through the beam splitter form an angle of 45°, to send out a beam to an auto focus module, and is characterized by reflecting a beam of a long wavelength, transmitting or reflecting a beam of a short wavelength, and transmitting a beam of a long wavelength. The optical element may be comprised of one of a hot mirror or a cold mirror.

In one embodiment, the auto focus module adjusts a focus, and senses a distance between the objective lens and a wafer by using a laser. That is, the auto focus module calculates a phase difference caused by a change in the position of a focus of the detector. The auto focus module may use an auto focus sensor module based on a phase difference. For example, in the case where a focus obtained by the auto focus sensor module is aligned with a 'standard focus', a phase difference value calculated by the auto focus sensor module may be 0, and in the case where the focus is not aligned with the standard focus, the phase difference value may be a + value or a − value depending on the position of the focus. The 'standard focus' is the focus of the first or second detector, or the auto focus sensor, which is determined based on a laser signal of the image formation of the sensor. The 'standard focus' may be aligned with a 'measurement focus' that is appropriate to obtain an actual alignment image, but in the case where there is a big difference in the heights of the first overlay mark OM1 and the second overlay mark OM2, may usually differ.

The auto focus sensor obtains a signal based on the position of a focus by using a reflected light reflected from the measurement area of a wafer, and to adjust the position of the focus, the actuator adjusting a distance between the measure area of the wafer and the objective lens is adjusted.

In one embodiment, the memory 180 may store instructions or data in relation to at least one of the other components of the overlay measuring device 100. The memory 180 may store information on a height value in relation to each site of a wafer and the position of a corresponding site, and store at least a part of the instructions, algorithms, programs and software that are needed to obtain and store the information.

Additionally, the memory 180 may store preset setting values, and data (e.g., a height value and position information and the like) that are generated based on the operation of the processor 170, in the overlay measuring device 100.

Further, the memory 180 may store a position measured at a first wafer, and the stored position may be used to move in advance from a second wafer following the first wafer to a position to be measured.

Furthermore, the memory 180 may store instructions for executing various functions that may be performed by the overlay measuring device 100.

In one embodiment, the processor 170 obtains a height value (e.g., a distance between the objective lens and a site, a first height) in relation to each site of a wafer placed on a stage 190, and matches the obtained first height value and the position information on a corresponding site (e.g., the position of a corresponding site on the wafer) and store the same. The processor 170 may measure a height value in relation to each site of a wafer placed on the stage 190 by controlling the auto focus (AF) 161.

In one embodiment, to reduce measurement time in relation to a wafer, the processor 170 stores a measurement position at a first wafer (e.g., a first wafer) in the memory 180, and moves the objective lens to the stored measurement position in relation to the first wafer at a time of measurement in relation to a second wafer (e.g., a wafer measured following the first wafer).

For example, a laser is used to determine the measurement position in relation to the first wafer, and the measurement position is transmitted and recorded to a GUI program, in real time, through an autofocus board.

Then the objective lens moves in advance, based on the recorded measurement position, from the second wafer, and a difference between the first and second wafers' measurement positions may be corrected based on the performance of an auto focus. Additionally, a value of the measurement position in relation to the second wafer is transmitted and recorded to a GUI program, in real time, through an autofocus board.

Further, the processor 170 may perform/execute an algorithm for correcting a difference between the first wafer and the second wafer, based on the above-described information.

Hereafter, the Z-axis movement of the objective lens is described based on the heights of sites on one wafer/based on a difference in the heights of sites on one wafer but described as an example. The subject matter of the present disclosure may be applied between wafers (e.g., a first wafer and a second wafer).

A plurality of fields may be formed on one wafer, and a plurality of sites (e.g., four sites) may be in one field. The processor 170 may obtain a value of the height in relation to each site and information on the position of a corresponding site. The processor 170 may match the obtained height value and the position information and store the same in the memory 180.

For example, the memory 180 may store a table in which the coordinate of each site of a wafer, and a sample height, a predicted height, a measured height and an X-axis movement value corresponding to the coordinate of each site are listed. Table 1, hereafter, is an example of the above-described table.

TABLE 1

| X | Y | Sample height | Predicted height | Current height | Z-axis movement value |
|---|---|---|---|---|---|
| 0 | 0 | 99 | | 100 | 99->100 |
| 0 | 1 | 100 | | 100 | 100->100 |
| ... | ... | ... | ... | ... | ... |
| N | N | 98 | 100 | 101 | 100->101 |

As shown in [Table 1], in the case where a sample height of a site of the X and Y coordinates (0, 0) is 99 and an actual height of the site is 100, the Z-axis of the objective lens moves by 1 (i.e., 100-99). Likewise, in the case where a sample height of a site of the X and Y coordinates (0, 1) is 100 and an actual height of the site is 100, the z-axis of the objective lens does not move, for example.

As described above, the processor 170 measures a sample height and an actual height in relation to the coordinate of each site and records the same in the above table.

Then in the case where a predicted height is 100 and an actual height is 101, in the state where a sample height of a site of the X and Y coordinates (N, N) is 98, the Z-axis of the objective lens moves by 1 (i.e., 101-100). Herein, the predicted height (i.e., 100) at the X and Y coordinates (N, N) is a value that is calculated by modeling preceding data.

To this end, the processor 170 may perform a sampling operation (a preceding process) in which the processor 170 obtains a height value in relation to a sample site of a wafer, and position information of the sample site corresponding to the height value, and stores the same in the memory 180. The processor 170 may obtain a height value in relation to the sample site at angles from 0 degree to 180 degrees, based on the sampling operation.

In one embodiment, in the case where initial measurement in relation to each site of a wafer (i.e., a process of adjusting a focal length in relation to a site to a predicted height after the preceding process) starts, the processor 170 may control the lens focus actuator 125, based on a stored first height value of a corresponding site, to control the Z-axis movement of the objective lens 120.

The processor 170 may move the stage 190 on which a wafer is placed, on the X and Y axes, and control the Z-axis movement of the objective lens 120. For example, the processor 170 may control the X and Y-axis movement of the stage 190 and the Z-axis movement of the objective lens 120 at the same time. That is, the processor 170 may adjust a focal length of the objective lens 120 at the same time as the processor 170 controls the X and Y-axis movement of the stage 190.

According to the present disclosure, a distance moved by the objective lens 120 decreases, such that time (e.g., Move Acquire Measure (MAM) time) for which a site is measured may decrease efficiently.

In one embodiment, the processor 170 obtains a second height value in relation to a wafer (e.g., a corresponding site of a wafer) and models a difference between the first height value and the second height value in the state where the Z-axis movement of the objective lens 120 is completed, to predict a height value of the following site. The above-described modeling may denote predicting a height value of the following site. For example, the processor 170 may predict a distance value at the following site, by using a distance value measured at the current site. Additionally, the processor 170 may check whether there is an error in the height value obtained based on the prediction. The modeling process may comprise various types of modeling as well as modeling based on a least square method.

Further, the processor 170 may control the Z-axis movement of the objective lens, at the following site, based on the predicted height value. For example, the processor 170 may adjust the focus of the objective lens 120 to the predicted height value, to recognize the patter of the following site.

The processor 170, as described above, applies a height value, obtained at a current site in relation to each of the plurality of sites included in each of the plurality of fields of a wafer, to the following site, to control the X and Y-axis movement of the stage 190 and the Z-axis movement of the objective lens 120 at the same time.

Alternatively, the processor 170 applies a height value obtained at a current wafer to the following wafer, to control the X and Y-axis movement of the stage 190 and the Z-axis movement of the objective lens 120 at the same time. By doing so, time (e.g., MAM time) for which a site is measured may decrease efficiently, according to the present disclosure.

After controlling the X and Y-axis movement of the stage 190 and the Z-axis movement of the objective lens 120 at the same time, the processor 170 may perform the process (e.g., PRU Grab) of controlling the X and Y-axis movement of the stage 190 such that a measurement target is moved to the center of a field of view (FOV) image by using a pattern recognition unit (PRU) in relation to/for a wafer. The processor 170 may perform the process (e.g., Measure Focus Move) of controlling the Z-axis movement of the objective lens 120 and then a measuring process (e.g., Measure), for measurement in relation to an FOV image.

In one embodiment, the processor 170 may comprise a Z-axis controller that can control the focal length (e.g., the Z-axis movement) of the objective lens 120, based on control of the lens focus actuator 125, and an X and Y-axis controller that can control the movement (e.g., the X and Y-axis movement) of the stage 190. Further, the processor 170 may store logic capable of modeling a difference between a first height value before the movements of the objective lens 120 and the stage 190 and a second height value after the movements of the objective lens 120 and the stage 190, in relation to each site.

The above-described processor 170 may be additionally provided in the overlay measuring device, or programmed and stored into another component.

The processor 170, as described above, may obtain a first height value in relation to each site of a wafer, match the obtained first height value and a corresponding site and store the same, and as initial measurement in relation to each site of the wafer starts, control the lens focus actuator, based on the stored first height value of the site, to control the Z-axis movement of the objective lens.

Additionally, the processor 170 may obtain first position information on a first wafer, store the obtained first position information in the memory, and as initial measurement in relation to a second wafer starts following the first wafer, controls the lens focus actuator, based on the stored first position information, to control the Z-axis movement of the objective lanes.

In one embodiment, the processor 170 may control the X and Y-axis movement of the stage on which the second wafer is placed, and the Z-axis movement of the objective lens at the same time.

In one embodiment, the processor 170 may obtain second position information on the second wafer in the state where the X-axis movement of the objective lens is completed, model a difference between a first height value of the first position information and a second height value of the second position information to predict a third height value of a third wafer following the second wafer, and control the Z-axis movement of the objective lens, based on the predicted third height value, at the third wafer.

According to the present disclosure, while the position of the objective lens may be adjusted based on a height value in relation to each site at one wafer, first position information on a first wafer may be obtained and stored in the memory 180, and as initial measurement in relation to a second wafer following the first wafer starts, the Z-axis movement of the objective lens may be controlled based on the stored first position information.

Hereafter, the adjustment of the position of the objective lens, based on a height value in relation to each site at one wafer, is described, but is described as an example. In the case where initial measurement in relation to a second wafer following the first wafer starts, the Z-axis movement of the objective lens may also be controlled based on the first position information on the first wafer.

Figure 2:
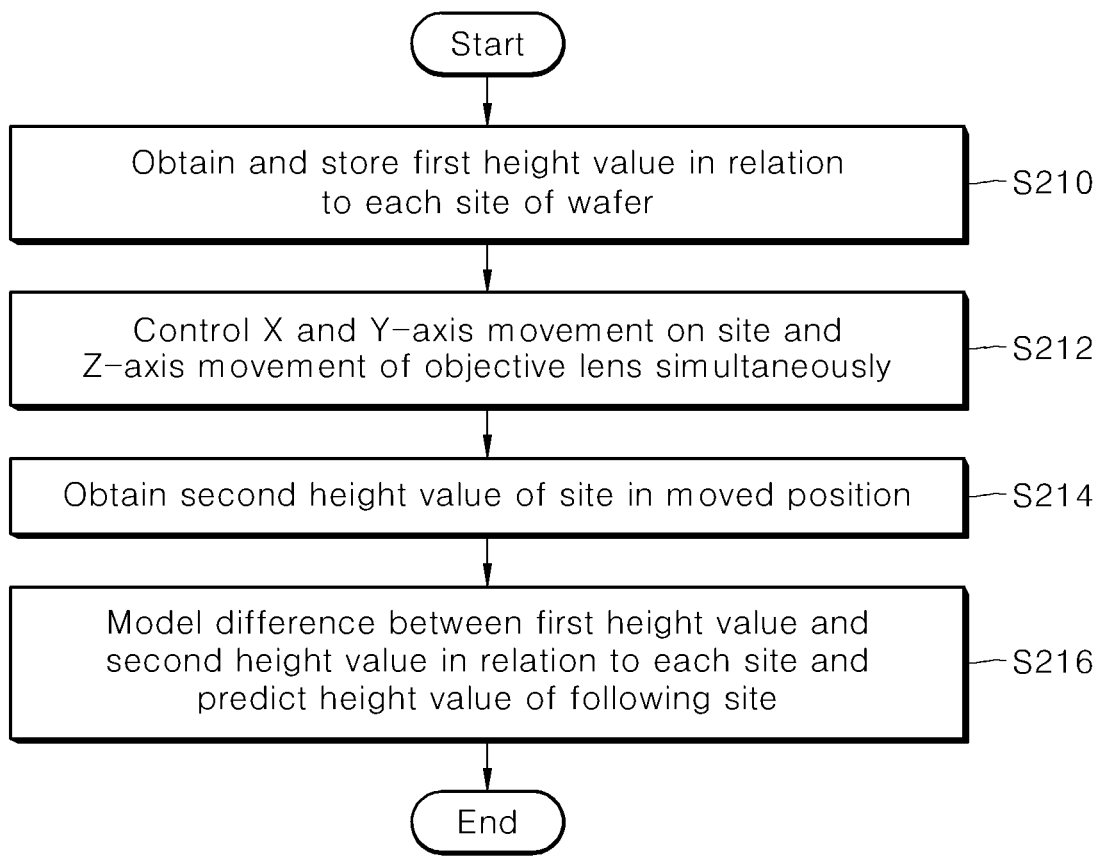
FIG. 2 is a flowchart showing a process of predicting a height value in relation to a site of a wafer in one embodiment.

FIG. 2 is a flowchart showing a process of predicting a height value in relation to a site of a wafer in one embodiment.

Hereafter, the process of predicting a height value in relation to a site of a wafer in one embodiment is described as follows, with reference to FIGS. 1 and 2.

In one embodiment, a processor 170 may obtain and store a first height value in relation to each site of a wafer, in a memory 180 (S210). The processor 170 may obtain a height value (e.g., a distance between an objective lens 120 and a site) in relation to each site of a wafer placed on a stage 190. Additionally, the processor 170 may match the obtained height value (e.g., a first height value) and the position information on a corresponding site (e.g., the position of a corresponding site on a wafer), and store the same in the memory 180.

In one embodiment, the processor 170 may control the X and Y-axis movement on a site and the Z-axis movement of the objective lens 120 at the same time (S212). The processor 170 may control the stage 190 and a lens focus actuator 125 such that a process in which the stage 190 on which the wafer is placed moves on the X and Y axes, and a process in which the objective lens 120 moves in the Z-axis, based on the height value and the position information stored in the memory 180, may be performed at the same time.

The processor 170, as described above, may simultaneously control the X and Y-axis movement of the stage 190, and the Z-axis movement of the objective lens 120, which is based on control of the lens focus actuator 125. That is, the processor 170 may move the Z axis of the objective lens 120 at the same time as the processor 170 moves the stage 190 on the X and Y axes, to adjust a focal length in relation to the site.

In one embodiment, the processor 170 may obtain a second height value in relation to a site, in the position where the objective lens 120 and the stage 190 are moved (S214). The processor 170 may obtain a second height value in relation to a site, in the position where the stage 190 and the objective lens 120 are moved, after the X and Y-axis movement of the stage 190 and the Z-axis movement of the objective lens 120 are completed at the same time. For example, the second height value may be greater or less than the first height value.

Further, the processor 170 may store the second height value and the position information on the site, in the memory 180.

In one embodiment, the processor 170 may predict a height value of each site by modeling a difference between the first height value and the second height value in relation to the site (S216). After the Z-axis movement of the objective lens 120 is completed, the processor 170 may obtain a second height value in relation to a corresponding site of a wafer, and predict a height value of the following site by modeling a difference between the first height value before the Z-axis movement of the objective lens 120 and the second height value. As described above, the modeling process may denote predicting a height value of the following site.

Figure 3:
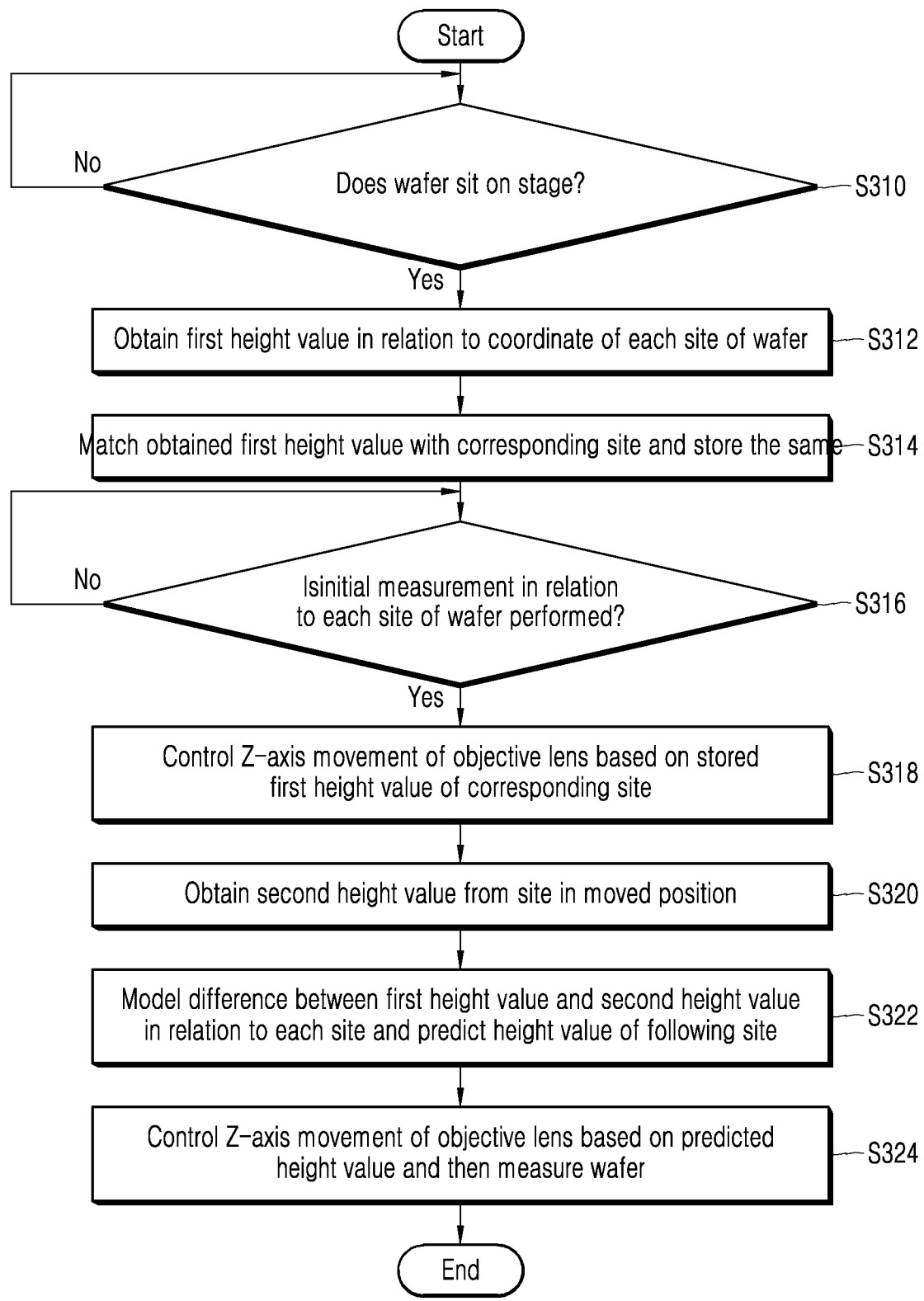
FIG. 3 is a flowchart showing a process of measuring a wafer based on prediction of a height value in relation to a site of the wafer in one embodiment.
Figure 4:
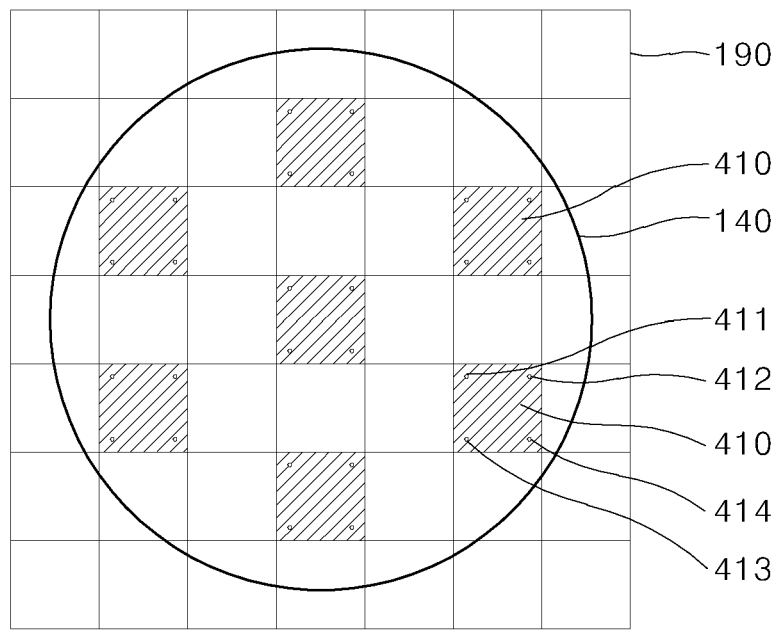
FIG. 4 is an exemplary view showing a state in which a wafer sits on a stage in one embodiment.

FIG. 3 is a flowchart showing a process of measuring a wafer based on prediction of a height value in relation to a site of the wafer in one embodiment. FIG. 4 is an exemplary view showing a state in which a wafer sits on a stage in one embodiment.

Hereafter, the process of measuring a wafer based on prediction of a height value in relation to a site of the wafer in one embodiment is described as follows, with reference to FIGS. 1, 3 and 4.

In one embodiment, as a wafer 140 sits on a stage 190, a processor 170 may obtain a first height value at the coordinate of each site of the wafer 140 (S310 and S312). As the wafer 140 sits on the stage 190, the processor 170 controls the X and Y-axis movement of the stage 190 and a lens focus actuator 125, to place an objective lens 120 over a site. Additionally, the processor 170 may obtain a height value in relation to the site to be measured, and position information on a sample site corresponding to the site.

Referring to FIG. 4, a plurality of fields 410 is disposed on the wafer 40. Each field 410 may be disposed on the wafer 140 in a way that the plurality of fields does not overlap each other. Additionally, each field 410 comprises a plurality of sites 411, 412, 413, 414. Each site may be a point where an FOV image may be obtained.

In one embodiment, the processor 170 may match the obtained first height value and the site and store the same (S314). A plurality of fields is formed on one wafer. A plurality of sites (e.g., four sites) may be present in one field. The processor 170 may match a height value in relation to each site of the wafer and information on the position of the site on the wafer, and store the same in a memory 180.

The processor 170, as described above, may perform a sampling operation (i.e., a preceding process) in which the processor 170 obtains a height value in relation to a sample site of the wafer 140 and position information on the sample site and stores the same in the memory 180.

In one embodiment, as initial measurement in relation to each site of a wafer starts, the processor 170 may control the Z-axis movement of the objective lens, based on the stored first height value of a corresponding site (S316, S318). After the initial measurement in relation to each site of the wafer 140 (i.e., a process of adjusting a focal length in relation to a site to a predicted height after the preceding process) starts, the processor 170 may control the lens focus actuator 125, based on the stored first height value, to control the Z-axis movement of the objective lens 120.

For example, as initial measurement starts, the processor 170 controls the X and Y-axis movement of the stage 190 and then controls the lens focus actuator 125, to place the objective lens 120 over a site, based on the first height value. Alternatively, the processor 170 may control the stage 190 and the lens focus actuator 125, such that the X and Y-axis movement of the stage 190 and the Z-axis movement of the objective lens 120 may be performed at the same time. By doing so, the processor 170 may adjust a focal length of the objective lens 120 at the same time as the processor 170 controls the X and Y-axis movement of the stage 190.

In one embodiment, the processor 170 may obtain a second height value of/from a site, in the position where the objective lens 120 is moved (S320). The processor 170 may control the operation of the lens focus actuator 125 such that the focal length of the objective lens 120 can be a second height value. Additionally, the processor 170 may obtain a second height value of/from a site in the position where the objective lens 120 is moved, as the focal length of the objective lens is adjusted based on the control over the operation of the lens focus actuator 125. For example, the processor 170 may store the second height value of/from a site, in the memory 180.

The processor 170, as described above, may adjust the focal length of the objective lens 120, after the preceding process, to complete the initial measurement process.

In one embodiment, the processor 170 may predict a height value of the following site by modeling a difference in the first height value and the second height value in relation to each site (S322). The processor 170 may predict a height value, i.e., a focal length, in relation to the following site, by using the first height value obtained in the preceding process, and the second height value obtained in the initial measurement process.

For example, the processor 170 may predict a focal length in relation to the following site by deducting the second height value obtained in the initial measurement process from the first height value obtained in the preceding process and applying a deducted height value to a height value of the following site, to predict a focal length in relation to the following site. Alternatively, the processor 170 may predict a focal length at the following site by deducting the first height value obtained in the preceding process from the second height value obtained in the initial measurement process and applying a deducted height value to a height value of the following site, to predict a focal length in relation to the following site.

In one embodiment, the processor 170 may measure the wafer after controlling the Z-axis movement of the objective lens, based on the predicted height value (S324). The processor 170 may apply the deducted height value to the height value of the following site, adjust the focal length by controlling the Z-axis movement of the objective lens 120, and then measure the site of the wafer 140.

Additionally, the processor 170 may control the Z-axis movement of the objective lens, based on the predicted height value, and then control the X and Y-axis movement of the stage 190 by using a PRU in relation to/for the wafer such that a measurement target is moved to the center of an FOV image. Further, the processor 170 may perform measurement in relation to the FOV image by controlling the Z-axis movement of the objective lens 120.

According to the present disclosure, since after a focal length of the objective lens 120 in relation to a site of a wafer is predicted, the predicted focal length is applied to the X and Y-axis movement of the stage 190 and the focal length of the objective lens 120, time (e.g., MAM time) for which the following site is measured may decrease efficiently, as described above.

Each of the above-described steps in the flowcharts may be performed regardless of the order illustrated, or performed at the same time. Further, in the present disclosure, at least one of the components, and at least one operation performed by at least one of the components can be embodied with/as hardware and/or software.

The embodiments are described above with reference to a number of illustrative embodiments thereof. However, embodiments are not limited to the embodiments and drawings set forth herein, and numerous other modifications and embodiments can be drawn by one skilled in the art within

| Description of reference numerals | |
| --- | --- |
| 100: Overlay measuring device | 110: Light source |
| 112: First beam splitter | 113: First mirror |
| 114: First spectrum filter | 115: Second spectrum filter |
| 116: Beam combiner | 117: Second mirror |
| 118: Relay lens | 120: Objective lens |
| 121: Polarizing filter | 122: Lambda wave plate |
| 124: Third beam splitter | 125: Lens focus actuator |
| 127: Tube lens | 130: Second beam splitter |
| 131: First detector | 132: Zoom lens |
| 133: Second detector | 134: Focus actuator |
| 151: Aperture | 161: AF |
| 170: Processor | 180: Memory |

The invention claimed is:

1. An overlay measuring device controlling a focus, comprising:
   an objective lens;
   a memory;
   a lens focus actuator operating the objective lens to adjust a distance between the objective lens and a wafer;
   a processor controlling operations of the memory and the lens focus actuator,
   wherein the processor is configured to obtain a first height value in relation to each site of the wafer,
      match the obtained first height value and a corresponding site and store the same,
      as initial measurement in relation to each site of the wafer starts, control the lens focus actuator, based on the stored first height value of the site, to control a Z-axis movement of the objective lens,
      obtain a second height value in relation to the wafer in a state where the Z-axis movement of the objective lens is completed,
      model a difference between the first height value and the second height value to predict a height value in relation to a following site, and
      control the Z-axis movement of the objective lens, based on the predicted height value, at the following site.

2. The overlay measuring device of claim 1, wherein the processor is configured to control a X and Y-axis movement of a stage on which the wafer is placed, and a Z-axis movement of the objective lens at the same time.

3. The overlay measuring device of claim 1, wherein the processor is configured to store a height value that is obtained at a current site of the wafer, in the memory, and
   apply the height value obtained at the current site to a following site, to control the Z-axis movement of the objective lens.

4. The overlay measuring device of claim 2, wherein the processor is configured to adjust a focal length of the objective lens at a time of a X and Y-axis movement of the stage.

5. The overlay measuring device of claim 1, wherein the processor is configured to apply a height value that is obtained at a current site, in relation to each of a plurality of sites included in each of a plurality of fields formed at the wafer, to a following site, to control the Z-axis movement of the objective lens.

6. The overlay measuring device of claim 1, wherein each of the first height value and the second height value is calculated based on a phase difference caused by a change in a position of a focus at the site.

7. A method for controlling a focus by an overlay measuring device, comprising:
   obtaining a first height value in relation to each site of a wafer;
   matching the obtained first height value and a corresponding site and storing the same;
   as initial measurement in relation to each site of the wafer starts, controlling a Z-axis movement of the objective lens, based on the stored first height value of the site;
   obtaining a second height value in relation to the wafer in a state where the Z-axis movement of the objective lens is completed;
   modeling a difference between the first height value and the second height value to predict a height value in relation to a following site; and
   controlling the Z-axis movement of the objective lens, based on the predicted height value, at the following site.

8. The method of claim 7, wherein controlling a Z-axis movement of the objective lens comprises controlling an X and Y-axis movement of a stage on which the wafer is placed, at the same time.

9. The method of claim 7, further comprising:
   storing a height value obtained at a current site of the wafer, in a memory; and
   applying the height value obtained at the current site to a following site, to control the Z-axis movement of the objective lens.

10. The method of claim 7, further comprising:
    applying a height value that is obtained at a current site, in relation to each of a plurality of sites included in each of a plurality of fields formed at the wafer, to a following site, to control the Z-axis movement of the objective lens.

11. A computer-readable storage medium in which a program storing instructions to control a focus of an overlay measuring device is recorded,
    the program, comprising:
    instructions to obtain a first height value in relation to each site of a wafer;
    instructions to match the obtained first height value and a corresponding site and store the same;
    as initial measurement in relation to each site of the wafer starts, instructions to control a Z-axis movement of the objective lens, based on the stored first height value of the site;
    instructions to obtain a second height value in relation to the wafer in a state where the Z-axis movement of the objective lens is completed;
    instructions to model a difference between the first height value and the second height value to predict a height value in relation to a following site; and
    instructions to control the Z-axis movement of the objective lens, based on the predicted height value, at the following site.

12. The computer-readable storage medium of claim 11, wherein the program comprises instructions to control an X and Y-axis movement of a stage on which the wafer is placed, and a Z-axis movement of the objective lens, at the same time.

13. The computer-readable storage medium of claim 11, the program, comprising:

instructions to store a height value obtained at a current site of the wafer, in a memory; and instructions to apply the height value obtained at the current site to a following site, to control the Z-axis movement of the objective lens.

14. The computer-readable storage medium of claim 11, the program, comprising:

instructions to apply a height value that is obtained at a current site, in relation to each of a plurality of sites included in each of a plurality of fields formed at the wafer, to a following site, to control the Z-axis movement of the objective lens.

15. An overlay measuring device controlling a focus, comprising:

an objective lens;

a memory;

a lens focus actuator operating the objective lens to adjust a distance between the objective lens and a wafer; and a processor controlling operations of the memory and the lens focus actuator, wherein the processor is configured to obtain first position information on a first wafer, store the obtained first position information in the memory, as initial measurement in relation to a second wafer following the first wafer starts, control the lens focus actuator, based on the stored first position information, to control a Z-axis movement of the objective lens, obtain second position information on the second wafer in a state where the Z-axis movement of the objective lens is completed, model a difference between a first height value of the first position information and a second height value of the second position information to predict a third height value of a third wafer following the second wafer, and control the Z-axis movement of the objective lens, based on the predicted third height value, at the third wafer.

16. The overlay measuring device of claim 15, wherein the processor is configured to control a X and Y-axis movement of a stage on which the second wafer is placed, and a Z-axis movement of the objective lens at the same time.

17. The overlay measuring device of claim 15, wherein each of the first height value and the second height value is calculated based on a phase difference caused by a change in a position of a focus at the site.

\* \* \* \* \*